United States Patent [19]

Cohen

[11] Patent Number: 4,714,913
[45] Date of Patent: Dec. 22, 1987

[54] QUADRATURE PHASE SIGNAL PROCESSOR

[76] Inventor: Robert K. Cohen, 244 Hansen Ave., Albany, N.Y. 12208

[21] Appl. No.: 755,473

[22] Filed: Jul. 16, 1985

[51] Int. Cl.[4] .............................................. H03M 1/30
[52] U.S. Cl. ........................... 340/347 P; 250/231 SE; 328/133; 340/347 M; 377/17; 377/51
[58] Field of Search .......... 340/347 P, 347 M, 870.29; 250/231 SE; 377/45, 51, 17; 328/133; 364/178, 179

[56] References Cited

U.S. PATENT DOCUMENTS

| | | | |
|---|---|---|---|
| 3,603,773 | 9/1971 | Carlstein | 340/347 DA X |
| 3,906,194 | 9/1975 | Fairbairn | 235/92 |
| 4,334,222 | 6/1982 | Kelley et al. | 340/870.29 |
| 4,379,221 | 4/1983 | Avins et al. | 340/347 P X |
| 4,447,700 | 5/1984 | Cohen | 219/117.1 |
| 4,461,944 | 7/1984 | Cohen | 219/110 |
| 4,476,567 | 10/1984 | Johnson | 377/24 |
| 4,568,912 | 2/1986 | Kitamura et al. | 340/347 DA X |

OTHER PUBLICATIONS

Anderholm, Time-Tag Generator for Variable Sampling Rate—, IBM Technical Disclosure Bulletin, vol. 8, No. 11, 4/1966, pp. 1520 & 1521.
Hancock, Bi-Directional Count from Quadrature Signals, Electronic Engineering, May 1978, p. 24.
The Engineering Staff of Analog Devices, Inc., Analog-Digital Conversion Handbook, 6/1972, pp. II-16 to II-25.

*Primary Examiner*—T. J. Sloyan
*Attorney, Agent, or Firm*—Heslin & Rothenberg

[57] ABSTRACT

A signal processor converts quadrature phase signals, from an encoder, representative of a measured parameter, into data which is directly readable by a computer and representative of the magnitude and direction of the current value of the parameter. The signal processor decodes binary signals representative of successive samples of the quadrature phase signals into UP signals, DOWN signals, ERROR signals and NO CHANGE signals. The UP and DOWN signals are converted into corresponding pulse streams which drive an up-down counter. Range control circuitry facilitates extension of the measuring range of the processor beyond that of the counter. Error control circuitry provides an ERROR INTERRUPT signal to the computer when an illegal condition occurs and also preserves the last valid data occurring before the illegal condition. Change control circuitry advises the computer when a change in the parameter being measured is initiated and completed so that the computer can selectively sample processor output data only in response to changes in the measured parameter.

13 Claims, 7 Drawing Figures

FIG. 5

| | POSSIBLE DECODER INPUTS | | | | INTERPRETATION | DECODER OUTPUTS | | | | | | | | | | | | | | | |
|---|---|---|---|---|---|---|---|---|---|---|---|---|---|---|---|---|---|---|---|---|---|
| | d | c | b | a | | 15 | 14 | 13 | 12 | 11 | 10 | 9 | 8 | 7 | 6 | 5 | 4 | 3 | 2 | 1 | 0 |
| 0 | 0 | 0 | 0 | 0 | N | 1 | 1 | 1 | 1 | 1 | 1 | 1 | 1 | 1 | 1 | 1 | 1 | 1 | 1 | 1 | 0 |
| 1 | 0 | 0 | 0 | 1 | U | 1 | 1 | 1 | 1 | 1 | 1 | 1 | 1 | 1 | 1 | 1 | 1 | 1 | 1 | 0 | 1 |
| 2 | 0 | 0 | 1 | 0 | D | 1 | 1 | 1 | 1 | 1 | 1 | 1 | 1 | 1 | 1 | 1 | 1 | 1 | 0 | 1 | 1 |
| 3 | 0 | 0 | 1 | 1 | E | 1 | 1 | 1 | 1 | 1 | 1 | 1 | 1 | 1 | 1 | 1 | 1 | 0 | 1 | 1 | 1 |
| 4 | 0 | 1 | 0 | 0 | D | 1 | 1 | 1 | 1 | 1 | 1 | 1 | 1 | 1 | 1 | 1 | 0 | 1 | 1 | 1 | 1 |
| 5 | 0 | 1 | 0 | 1 | N | 1 | 1 | 1 | 1 | 1 | 1 | 1 | 1 | 1 | 1 | 0 | 1 | 1 | 1 | 1 | 1 |
| 6 | 0 | 1 | 1 | 0 | E | 1 | 1 | 1 | 1 | 1 | 1 | 1 | 1 | 1 | 0 | 1 | 1 | 1 | 1 | 1 | 1 |
| 7 | 0 | 1 | 1 | 1 | U | 1 | 1 | 1 | 1 | 1 | 1 | 1 | 1 | 0 | 1 | 1 | 1 | 1 | 1 | 1 | 1 |
| 8 | 1 | 0 | 0 | 0 | U | 1 | 1 | 1 | 1 | 1 | 1 | 1 | 0 | 1 | 1 | 1 | 1 | 1 | 1 | 1 | 1 |
| 9 | 1 | 0 | 0 | 1 | E | 1 | 1 | 1 | 1 | 1 | 1 | 0 | 1 | 1 | 1 | 1 | 1 | 1 | 1 | 1 | 1 |
| 10 | 1 | 0 | 1 | 0 | N | 1 | 1 | 1 | 1 | 1 | 0 | 1 | 1 | 1 | 1 | 1 | 1 | 1 | 1 | 1 | 1 |
| 11 | 1 | 0 | 1 | 1 | D | 1 | 1 | 1 | 1 | 0 | 1 | 1 | 1 | 1 | 1 | 1 | 1 | 1 | 1 | 1 | 1 |
| 12 | 1 | 1 | 0 | 0 | E | 1 | 1 | 1 | 0 | 1 | 1 | 1 | 1 | 1 | 1 | 1 | 1 | 1 | 1 | 1 | 1 |
| 13 | 1 | 1 | 0 | 1 | D | 1 | 1 | 0 | 1 | 1 | 1 | 1 | 1 | 1 | 1 | 1 | 1 | 1 | 1 | 1 | 1 |
| 14 | 1 | 1 | 1 | 0 | U | 1 | 0 | 1 | 1 | 1 | 1 | 1 | 1 | 1 | 1 | 1 | 1 | 1 | 1 | 1 | 1 |
| 15 | 1 | 1 | 1 | 1 | N | 0 | 1 | 1 | 1 | 1 | 1 | 1 | 1 | 1 | 1 | 1 | 1 | 1 | 1 | 1 | 1 |

N = NO CHANGE    E = ERROR    U = UP    D = DOWN

QUADRATURE PHASE SIGNAL PROCESSOR

BACKGROUND OF THE INVENTION

1. Technical Field

This invention relates generally to signal processing and more particularly to an improved system for interfacing an encoder with quadrature phase outputs, such as a displacement sensor or rotary encoder, to a computer.

2. Background Information

Optical encoders which, either directly or after wave shaping, produce quadrature phase signals representative of linear or rotational displacement or some other variable parameter, are well known. The output signals from such encoders are often employed to provide a numeric display of the magnitude and direction of the measured parameter. In some applications the quadrature phase signals are processed to interface with a computer such as a microprocessor.

An example of the latter situation is the Resistance Spot Welder Adaptive Control which is the subject of the inventor's earlier patent, U.S. Pat. No. 4,447,700 issued May 8, 1984. In such application it is necessary to supply a computer with accurate displacement data which is used by the spot welder control system to control the formation of a resistance spot weld in process. The spot welder control system depends on the accuracy and reliability of the displacement signal in order to make decisions in real time affecting the welding parameters, and also to evaluate the resulting weld quality.

A quadrature phase signal displacement sensor and interface designed for use in such a spot welder control system is described in applicant's U.S. Pat. No. 4,461,944 dated July 24, 1984. The signal processor of this earlier patent employs an edge detection scheme to generate up and down pulses which in turn are converted into computer readable data that appears to the computer as a variable in its memory.

Many sources of interference occur in a factory where a spot welder may be employed which can result in noise being induced on the signal lines from the displacement transducer, causing the computer of the welder control system to misinterpret the displacement information. It is possible that this incorrect displacement data could then be used to make a bad decision associated with the real time selection of suitable welding parameters and/or to misclassify a good weld as bad or vice versa. Applicant has found that his prior edge detection method is subject to noise and requires extra shielding from intereference caused by 20,000 amp weld currents. Further applicant has determined that, when such noise or intereference occurs, the computer of the spot welder control system should be immediately informed of any inaccurate data points which are sampled as they occur in order to avoid making a suboptimal control decision. Without the ability to detect nonallowed states, inaccuracies can accumulate with each loss of tracking that occurs.

The displacement interface of applicant's prior U.S. Pat. No. 4,461,944 employs a 16-bit up-down counter which in two's complement format has a range of −32,768 to +32,767. Aside from increasing the size of the counter, the prior system makes no provision for accommodating displacements which exceed the stated range. Likewise applicant's earlier patent does not contemplate any technique for conserving computer overhead by selectively sampling the output data from the displacement interface only when a change in displacement occurs.

Other patents partially address certain of these limitations. For example, U.S. Pat. No. 3,906,194 to D. G. Fairbairn describes a quadrature phase signal processor which instead of edge detection employs a pair of cascaded clocked registers and a ROM to convert such signals into pulse trains which can drive counters or provide cursor control signals to a display monitor. A somewhat similar system is shown in U.S. Pat. No. 4,476,567 to R. F. Johnson. In the "Electronic Protractor" of this latter patent, angular deviations of a control surface cause phase quadrature output signals to be produced from an optical encoder. Successive values of the quadrature phase signals are latched into a PROM which in turn decodes these inputs into clockwise transitions, counter-clockwise transitions, no change conditions and illegal conditions. The clockwise and counter-clockwise transitions are registered by an up-down counter which in turn drives a digital display to indicate the magnitude and direction of the angular deviation of the control surface. The illegal condition is used to set a flip-flop which flags an error by turning on an error light. A reset button clears the flip-flop and turns off the error light.

Although U.S. Pat. No. 4,476,567 recognizes the existence of a "no change" state, no provision is made to use this information. In the event of an error condition, this previously patented signal processor simply produces a light output for an operator to visually see that there is an error. The counter is free to continue to change value so unless the operator happens to be looking at the display when the error light comes on, he would not know what the latest valid count value is, nor would the operator be able to obtain it. Further this patent does not discuss any method for dealing with a count value which goes out of range, i.e. which exceeds the maximum range of the counter.

Finally, U.S. Pat. No. 4,334,222 to M. R. Kelley et al discusses a count overflow protection circuit for use when the incremental detent count of an up-down counter exceeds the capacity of that counter. However, this circuit only provides for retention of a maximum count and does not facilitate extension of the range of the counter.

A need is thus perceived for an enhanced signal processor for converting quadrature phase signals into data directly readable by a computer, for spot welding control and other diverse applications, and which exhibits higher noise immunity, greater reliability, expanded range and increased processing efficiency.

SUMMARY OF THE INVENTION

The present invention satisfies this need by providing an improved quadrature phase signal processor which is capable not only of directly interfacing with a computer but also of effectively extending counter range, which is capable not only of detecting and signaling an illegal condition but also of preserving the last valid data, and which is capable not only of detecting a "no change" condition but also of processing this information to facilitate computer sampling of processor output data in an overhead efficient fashion. In its preferred form, the present invention employs a pair of clock gated cascaded registers to store successive values of the input quadrature phase signals. A 4 to 16 line decoder in conjunction with a plurality of NAND gates decodes and groups the outputs of the registers into UP signals, DOWN signals, NO CHANGE signals and ERROR signals. The UP and DOWN signals are converted by clocked pulse control circuitry into up and down pulse streams respectively. These pulse streams are fed to an up-down counter which outputs data in two's complement format to an output latch from which the output data is fed to a computer under the control of a DATA READ ACKNOWLEDGE signal from the computer.

Latch update control circuitry temporarily inhibits updating of the output latch in response to the computer supplied DATA READ ACKNOWLEDGE signal. Range control circuitry permits the range of the up-down counter to be extended without limit. The range control circuitry samples the two most significant bits of the counter output data to determine when an overflow or an underflow of the counter range occurs. When such a condition is detected an OUT-OF-RANGE interrupt and identifying flags are provided by the range control circuitry to the computer. The computer responds in a prescribed way to update a reference stored in the computer. The true value of the measured parameter can then be ascertained by summing the updated reference with the current output of the output latch.

The invention also contemplates error control circuitry for providing an ERROR INTERRUPT signal to the computer when an illegal condition is detected and for simultaneously preserving the last valid data for readout by the computer. The invention further contemplates change control circuitry responsive to NO CHANGE signals for providing NO CHANGE INTERRUPT and CHANGE interrupt signals to the computer. The computer can respond to these interrupt signals by selectively sampling processor output data only in response to changes thereby reducing computer processing overhead.

Accordingly, a principle object of the invention is to provide a signal processor for interfacing an encoder to a computer in which the processor converts quadrature phase signals from the encoder into data which the computer can directly read and from which it can easily formulate the current value of the parameter represented by the quadrature phase signals.

Another object is to provide such a processor which facilitates computer tracking of the value of the parameter over a range greater than that of the processor hardware.

Yet another object is to provide such a processor which can accommodate overflow or underflow of a measured parameter beyond the range of a counter within the processor and can, in combination with the computer, in effect, track the measured parameter over an unlimited range.

A further object is to provide such a processor which indicates the reliability of the data read by indicating when an error occurs and also preserves the last valid data, i.e. the latest count value before the error occurred.

A still further object is to provide such a processor which can determine and directly signal the computer when a change in the measured parameter is initiated and completed so that the computer can selectively sample only processor output data associated with such changes thereby reducing computer processing overhead.

Yet another object is to provide such a processor which can be readily and affordably constructed from existing components, is amenable to wide the diverse applications, and exhibits improved data reliability, noise immunity, range and overall integrated performance.

BRIEF DESCRIPTION OF THE DRAWINGS

These and other objects, features and advantages of the invention will be more fully appreciated from the following detailed description read in conjunction with the accompanying drawings in which:

FIG. 5 is a state diagram useful in understanding the decoding operation of the present invention;

DETAILED DESCRIPTION

The signal processor of the present invention is generally employed as an interface between an encoder and a computer. The encoder, which forms no part of the present invention, may be a linear or rotational position encoder, such as those described and illustrated in applicant's prior patent U.S. Pat. No. 4,461,944, or one associated with an infinitely adjustable knob such as that described in applicant's patent application entitled "Multichannel Graphic Data Entry Device For Interface With A Computer", or any similar device which produces, directly or after wave shaping or other processing, quadrature phase signals representative of a measured variable parameter. For purposes of the ensuing discussion the invention will be described in terms of converting quadrature phase signals representative of displacement of a position encoder into computer readable position data representative of the magnitude and direction of displacement. The invention may, of course, be applied to other encoders and measured parameters. The output signals of the signal processor of the present invention are particularly adapted for use by a computer, e.g. a microprocessor. The computer may be of a general purpose type or one dedicated to a particular purpose. The computer may interface with various other transducers, peripheral devices, displays, control devices and/or other computers and may be part of a larger system such as the adaptive control system for spot welding described in applicant's prior patent U.S. Pat. No. 4,447,700 or a Finite Element Modeling System such as that described in the copending application filed by applicant and Joel K. Shugar, or other system.

Figure 1:
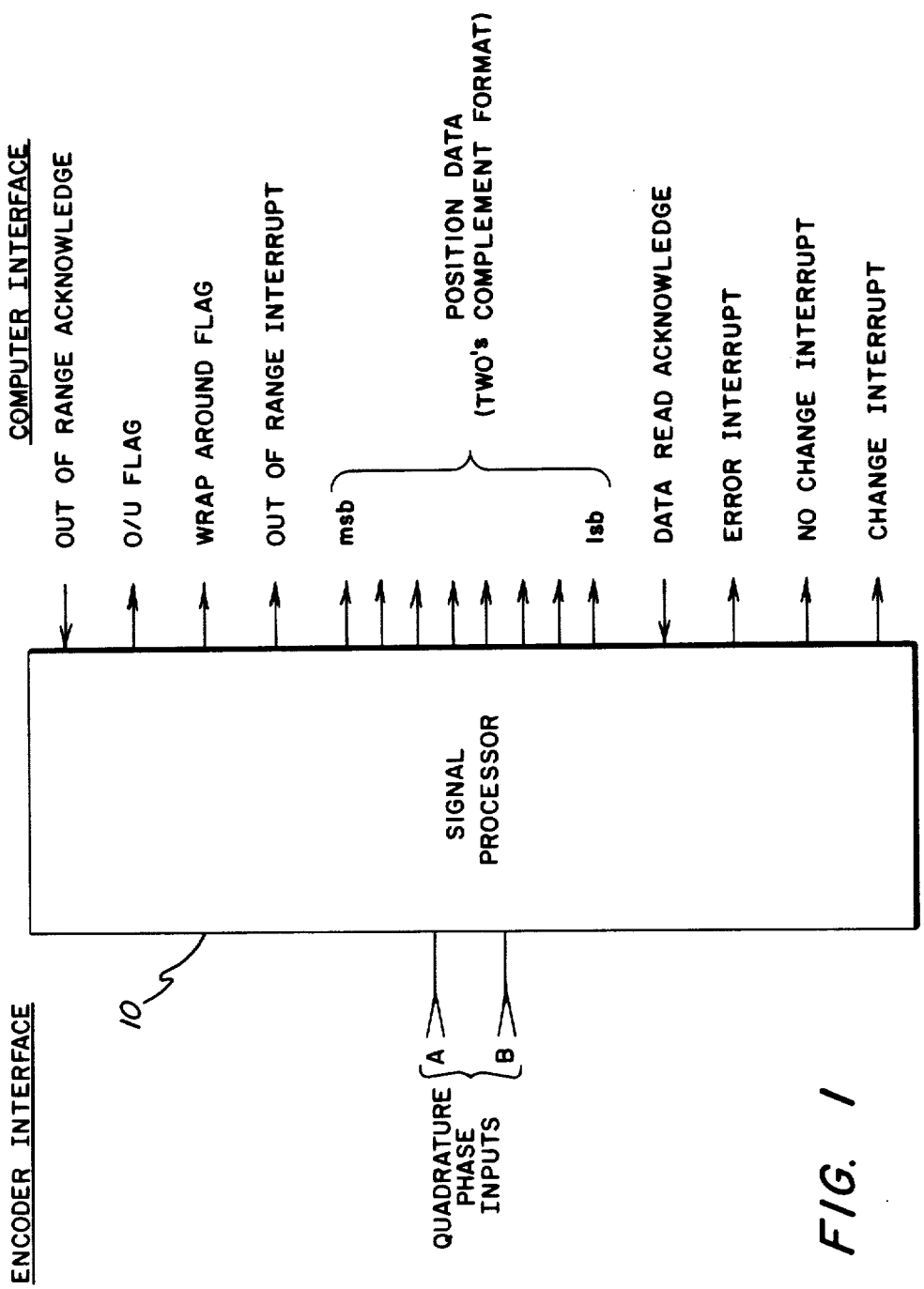
FIG. 1 is an input/output diagram of the signal processor of the present invention.

Referring now to FIG. 1, the input and output signals of the signal processor of the current invention are illustrated therein. Processor 10 receives a pair of quadrature phase inputs A and B from a position encoder or similar source. These signals are in binary form and have a 90° phase relationship. As is well known to those familiar with quadrature wave signals, the number of pulses provides an indication of the magnitude of displacement, the lagging or leading relationship between the signals indicates the direction of movement, and relative edge to edge times are a function of instantaneous velocity. Typical input signals will be described hereinafter with respect to FIG. 4.

Also shown in FIG. 1, are a series of computer interface lines/signals on the output side of signal processor 10. These include a set of POSITION DATA lines which represent the value of the current encoder position, i.e. magnitude and direction. This data is preferably in two's complement format since this is the most widely accepted number format for the representation of signed numbers in a computer. In the presently preferred embodiment, as more fully discussed hereinafter, output POSITION DATA is represented by an 8 bit wide two's complement number ranging from −128 to +127. The computer asserts a DATA READ ACKNOWLEDGE signal when reading these data lines.

The signal processor of the present invention applies an OUT-OF-RANGE signal to the computer each time the value of the measured parameter exceeds the range of a counter incoporated in the signal processor. An O/U FLAG provided to the computer distinguishes between counter overflow and counter underflow conditions. A WRAPAROUND FLAG alerts the computer to a reversal of the overflow or underflow condition should such a reversal occur before the computer has had a chance to respond to the out-of-range interrupt. The computer generates an OUT-OF-RANGE ACKNOWLEDGE signal in response to reading the O/U and WRAPAROUND FLAGS. This OUT-OF-RANGE ACKNOWLEDGE signal reinitializes range control circuitry in the signal processor. The operation of this circuitry and the interaction between the signal processor and the computer for purposes of, in effect, extending the range of the system, is more fully discussed hereinafter with reference to FIGS. 2, 6 and 7.

Also, as shown in FIG. 1, signal processor 10 provides the computer with ERROR INTERRUPT, NO CHANGE INTERRUPT and CHANGE INTERRUPT signals. The ERROR INTERRUPT signal is applied to the computer when an illegal input condition occurs. The NO CHANGE INTERRUPT signal is applied to the computer when no position change has occurred for a specified period of time. The CHANGE INTERRUPT signal advises the computer when a position change occurs after a no position change condition. The significance of these interrupt signals is more fully discussed below. For now it is sufficient to note that anytime the computer reads the POSITION DATA, it generates a DATA READ ACKNOWLEDGE which in turn removes any NO CHANGE INTERRUPT, CHANGE INTERRUPT or ERROR INTERRUPT signal. The DATA READ ACKNOWLEDGE also temporarily inhibits updating of POSITION DATA so that no change in the value of this data occurs while the computer is reading it.

Figure 2:
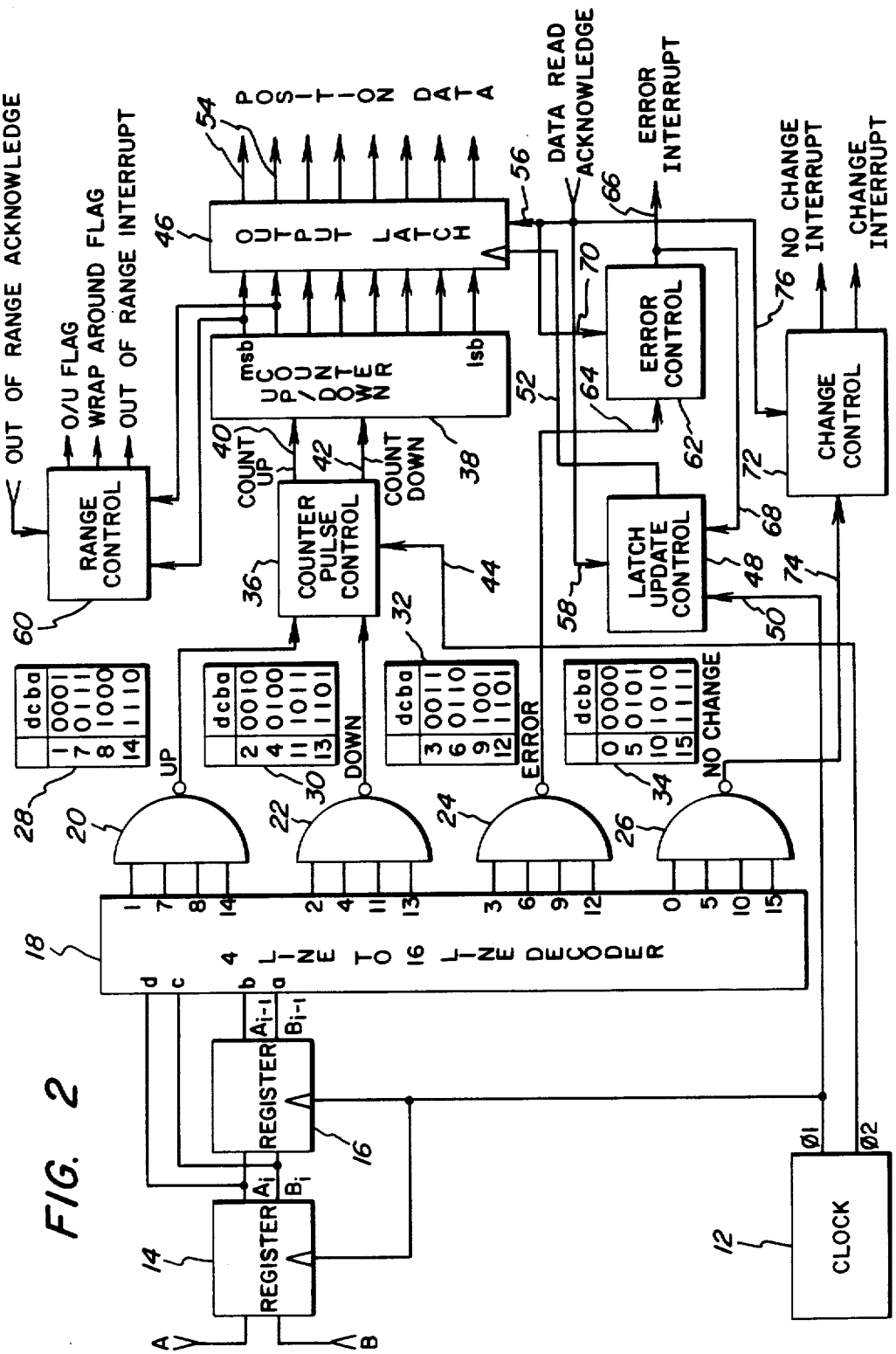
FIG. 2 is a block diagram of a preferred embodiment of the present invention.

FIG. 2 illustrates in block diagram format the presently preferred implementation of the signal processor 10 of the invention.

Figure 3:
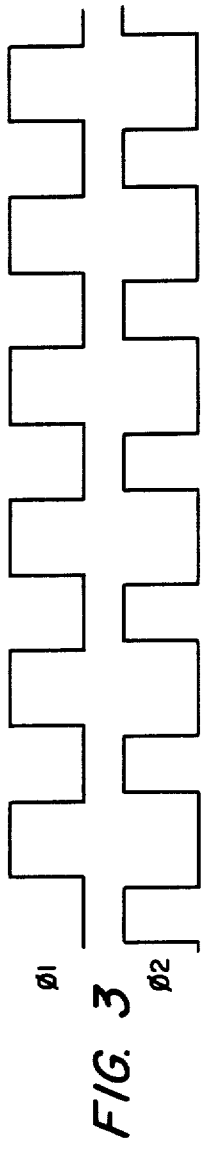
FIG. 3 is a wave form diagram illustrating alternate pulse outputs of a two phase clock, useful in an embodiment of the present invention.

A clock 12 provides the time base for operation of the processor circuitry shown in FIG. 2. Clock 12 may be a two phase clock producing alternate pulse clock signals 01 and 02. As illustrated in FIG. 3, the 02 clock signal pulses may be of slightly less duration than the intervals between the 01 clock signal pulses. Alternatively the second clock signal may simply be a half wave delayed version of the first clock signal.

The first clock signal 01 is simultaneously fed to a pair of cascaded registers 14 and 16, as shown in FIG. 2. In the preferred implementation, each of these registers is a 2 bit latch. Register 14 has for its inputs quadrature phase signals A and B. The outputs of register 14 are fed to register 16 as well as to inputs d and c of a 4 line to 16 line decoder 18. The outputs of register 16 form the other two inputs (b and a) of decoder 18. Each pulse of clock signal 01 latches the current binary values ($A_i$ and $B_i$) of the A and B inputs in register 14 and the previous values ($A_{i-1}$ and $B_{i-1}$) of the A and B inputs in register 16. The register 14 and register 16 outputs provide a 4 bit binary input, representing the transition between successive states of input signals A and B, to the inputs of 4 line to 16 line decoder 18, as shown.

Figure 4:
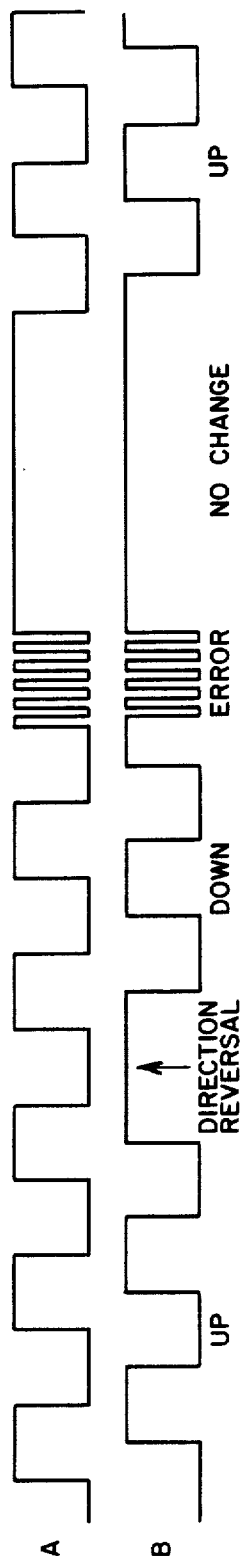
FIG. 4 is a wave form diagram illustrating quadrature phase signals representative of various encoder conditions.

FIG. 4 depicts four possible encoder conditions represented by quadrature phase signals A and B. Illustrated are representative binary quadrature phase signals from a vertical displacement measuring device. Initially shown is movement at a uniform velocity first up and then down. In this case the pulse waves have a 50% duty cycle and either a 90° leading or lagging relationship depending on the direction of movement. Relative edge to edge times are a function of instantaneous velocity. Noise, jitter, line interference or encoder movement at a rate faster than the frequency of clock signal 01 results in an error or illegal condition, as shown. A stationary encoder produces steady state signals indicative of "no change", as illustrated. Resumption of encoder movement or position change is indicated by the reoccurrence of pulses on quadrature phase signal lines A and B.

The frequency of clock signal 01 is generally selected to be much greater than the expected frequency of input signals A and B and, preferrably, can be selected to that it corresponds to the maximum desired change in the quadrature phase encoded inputs such that if a faster change occurs the user of computer would be alerted to the fact that the inputs are changing more rapidly than they are supposed to for a specific application. By way of example, the frequency of clock pulses might be ten times that of the quadrature phase input signals. During each clock pulse, inputs A and B are sampled. Decoder 18 processes these sampled signals to detect and decode state transitions between successive samples of the two input signals.

FIG. 5 depicts the 16 possible combinations of the four inputs to decoder 18, and the interpretation and decoder outputs for each of the possible input combinations. Note that "U" represents an up transition, "D" represents a down transition, "N" represents a no change condition, and "E" represents an error or illegal condition, occurring between successive samples.

Returning to FIG. 2, NAND gates 20, 22, 24 and 26 group like decoder outputs from decoder 18 into four signal groups, in accordance with state tables 28, 30, 32 and 34, respectively, to produce four output signals corresponding to the conditions of up, down, error, and no change. Counter pulse control circuitry 36 receives and processes UP signals from NAND gate 20, DOWN signals from NAND gate 22 and 02 clock signals from clock 12 to increment an up-down counter 38 with each UP signal occurrence and decrement the counter with each DOWN signal occurrence. In the preferred embodiment the UP signal gates clock pulses to an up input of the counter while the UP signal is active. Similarly the DOWN signal gates clock pulses to a down input of the counter when the DOWN signal is active. As shown a separate up pulse stream 40 and down pulse stream 42 connect counter pulse control circuitry 36 to up-down counter 38.

The count in counter 38 is updated in response to encoder displacement by the up and down pulse streams at a rate and in synchronization with the second clock signal 02 on line 44. Counter 38 is preferably an 8 bit up-down counter. The output of counter 38 is in two's complement format and represents the current value of the measured parameter, e.g. the magnitude and direction of encoder displacement. This output is fed to an output latch 46. The updating of latch 46 with the count from counter 38 is controlled by latch update control circuitry 48. This circuitry receives the 01 clock signal from clock 12 along line 50 and normally provides a latch update signal along line 52 to latch 46. The latch update signal is synchronized with clock signal 01 so that latch 46 is essentially being updated between counts of counter 38. The latch is updated with the most recent counter output from the previous clock pulse of the 02 clock signal.

The output of latch 46 are data lines 54 for input to a computer. The data lines connect to a computer input port or directly to the computer bus (not shown). A DATA READ ACKNOWLEDGE signal is provided by the computer to indicate that a data read operation is in progress. This DATA READ ACKNOWLEDGE signal transmitted along line 56 commands latch 46 to output its current value of position data to the computer. The DATA READ ACKNOWLEDGE signal is also transmitted along a line 58 to latch update control circuitry 48. This causes the latch update control circuitry to inhibit the further updating of output latch 46 during the computer data read operation.

Data lines 54 from output latch 46 provide a signed representation of encoder position in a two's complement format. This is the most widely accepted number format for the representation of signed numbers in a computer. In the case of the currently preferred implementation, the output of latch 46 is an 8 bit wide two's complement number ranging from −128 to +127. In accordance with one important aspect of the present invention, provision is made to, in effect, extend the range of the signal processor beyond that of the processor hardware, i.e. the 8 bit up-down counter and associated 8 bit latch.

The output of 8 bit counter 38 contains 256 possible states with its output interpreted as a two's complement number ranging from −128 to +127. The computer is able to track the value of displacement over a wider number range by accounting for each counter overflow and underflow as it occurs.

Figure 6:
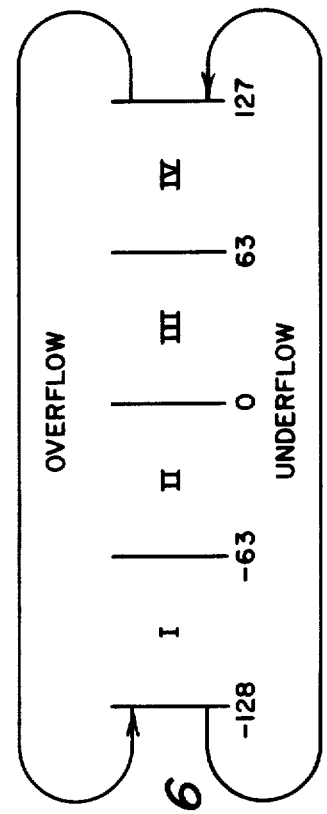
FIG. 6 is an illustration of the range of an 8 bit up-down counter, useful in understanding the range extension feature of the present invention.

As depicted in FIG. 6, the counter number range may be divided into four regions. Region I extending from −128 to −64, Region II extending from −63 to 0, Region III extending from 0 to +63 and Region IV extending from +64 to +127. Monotonically increasing encoder values cause transition from Region I to II to III to IV to I to II etc. and monotonically decreasing values cause transition from Region IV to III to II to I to IV to III etc., where Regions I and IV are, in effect, adjacent.

The computer normally would have to sample the counter output often enough to ensure that the counter does not skip over a region (or regions) without being sampled. Otherwise aliasing would occur resulting in loss of computer tracking of the displacement value. For example, if the last counter value sampled by the computer was in Region I and the next value sampled by the computer is in Region III it would be ambiguous as to whether Region II or Region IV was skipped over.

The computer, according to the present invention, accounts for transitions between Regions I and IV by internally formulating an updatable reference which is a multiple of 256. The computer adds 256 to the reference each time it monitors a transition from Region IV to I (i.e. an overflow) and substracts 256 from the reference each time it monitors a transition from Region I to IV (i.e. an underflow). The output of latch 46 is added to the updated reference to derive the true value of the measured parameter.

To remove the burden of the computer having to check for a IV to I or I to IV region transition with each sampled data point, range control circuitry is incorporated into the signal processor to generate a computer interrupt whenever a transition between these two regions occur. With such an interrupt scheme, no constraint need be placed on the rate of computer sampling of the encoder value and the range of the counter hardware can, in effect, be extended without limit.

Referring again to FIG. 2 an OUT-OF-RANGE INTERRUPT signal is provided to the computer by range control circuitry 60 to indicate the counter 38 has overflowed past +127 to become −128 or underflowed past −128 to become +127. The range control circuitry detects these conditions by monitoring the two most significant output bits from counter 38. A simultaneous opposite change of state of the two most significant bits indicates a transition between Regions I and IV. The state of the most significant bit immediately following transition indicates whether an overflow or an underflow has occurred. An O/U FLAG provided by range control circuitry 60 to the computer distinguishes between an overflow condition and an underflow condition.

Figure 7:
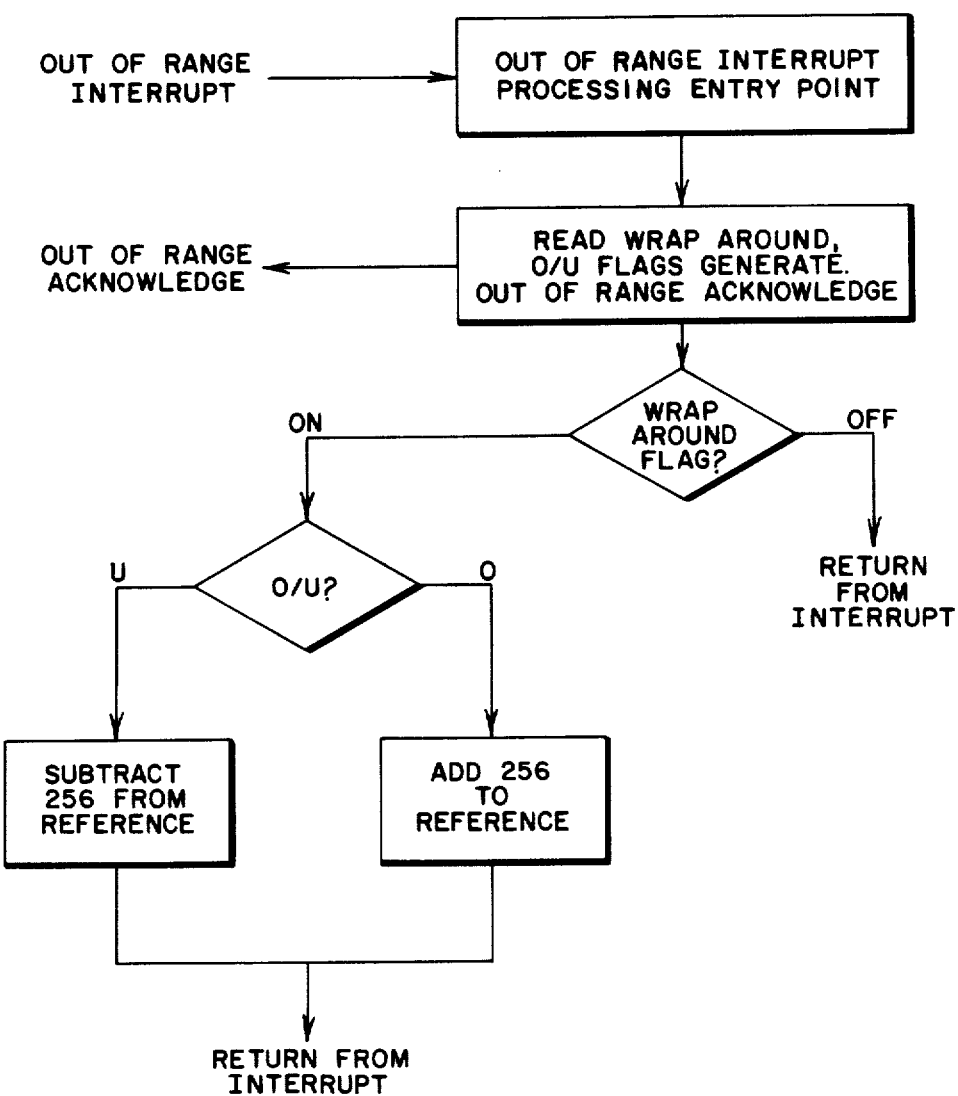
FIG. 7 is simplified flow chart of an out-of-range interrupt processing program.

FIG. 7 is a flow chart typical of the processing performed by the computer each time an out-of-range interrupt condition occurs. The computer routine responds to an out-of-range interrupt by simultaneously reading the O/U FLAG and a WRAPAROUND FLAG. The computer generates and transmits to the processor an OUT-OF-RANGE ACKNOWLEDGE signal upon reading these flags. This acknowledge signal also serves to reset the OUT-OF-RANGE INTERRUPT signal back to its non-active state.

In the case of rapidly fluctuating encoder values, it is possible for an underflow condition to occur immediately followed by an overflow condition or vice versa. The net result in either of these cases is cancellation of the out-of-range condition. The WRAPAROUND FLAG alerts the computer to such cancellation, in the event that the computer has started to respond to the OUT-OF-RANGE INTERRUPT but not yet read the O/U and WRAPAROUND FLAGS.

When an OUT-OF-RANGE INTERRUPT signal is generated in response to an underflow condition, an overflow condition occuring before the computer acknowledges the out-of-range interrupt condition causes the OUT-OF-RANGE INTERRUPT signal to be reset. Likewise, when an OUT-OF-RANGE INTERRUPT signal is generated in response to an overflow condition, an underflow condition occuring before the computer acknowledges the out-of-range interrupt condition causes the OUT-OF-RANGE INTERRUPT signal to be reset. In the event that cancellation of the out-of-range condition occurs after the computer responds to the OUT-OF-RANGE INTERRUPT but prior to acknowledgement by reading the WRAPAROUND FLAG and the O/U FLAG, the WRAPAROUND FLAG will assume an "off" state to let us computer know to take no action in response to the interrupt.

On the other hand if the WRAPAROUND FLAG is in the "on" state the computer reads the O/U FLAG which indicates to the computer whether it is responding to an overflow or an underflow condition. In the case of an overflow, the computer adds 256 to its internal reference. In the case of an underflow, the computer subtracts 256 from its internal reference. This arithmetic operation continually updates a reference in the computer allowing the computer to keep track of the measured parameter over a range larger than that of the counter 38.

Referring again to FIG. 2, it will be seen that the signal processor of the present invention also includes error control circuitry 62 for receiving ERROR signals along line 64 from NAND gate 24. Error control circuitry 62, in response to receipt of an ERROR signal, generates an ERROR INTERRUPT signal which is provided along line 66 to the computer and along line 68 to latch update control circuitry 48. The ERROR INTERRUPT signal advises the computer of the occurrence of an illegal input condition and also signals the latch update control circuitry 48 to inhibit the further updating of output latch 46 until the latch output data is read by the computer thereby allowing the computer to determine the last valid data value before the error occurred. As indicated earlier, the DATA READ ACKNOWLEDGE signal from the computer is transmitted along line 58 to latch update control circuitry 48 to reinitialize same. The DATA READ ACKNOWLEDGE signal is also transmitted along line 70 to reinitialize error control circuitry 62.

Also shown in FIG. 2 is change control circuitry 72 which responds to NO CHANGE signals on line 74 from NAND gate 26 by providing NO CHANGE INTERRUPT and CHANGE INTERRUPT signals to the computer. The NO CHANGE INTERRUPT signal is generated after no change in encoder value occurs for a period of time T and indicates to the computer completion of a change in encoder position. This time delay T ensures that the encoder has stabilized in a nonmoving position when the value is read by the computer and not just momentarily stopped for a short time interval. The computer would typically respond to a NO CHANGE INTERRUPT signal by reading the data value which removes this interrupt signal until the next time a no change condition occurs, following a change condition.

A change in encoder state after initiation of a NO CHANGE INTERRUPT signal causes generation of a CHANGE INTERRUPT signal indicating to the computer initiation of a change in encoder position. The computer would typically respond by reading the data value which removes this interrupt signal until the next time a change condition occurs, following a no change condition. The DATA READ ACKNOWLEDGE signal from the computer is provided along line 76 to appropriately reinitialize change control circuitry 72.

The NO CHANGE and CHANGE INTERRUPT signals provide the computer with a means for determining when encoder movement has started and/or stopped without the need for the computer to continually monitor sequential data values and compare these to the past history, thereby saving on computer overhead.

If desired, the computer may be programmed to sample processor output data only during time periods associated with a change in parameter value. For example, in the case of a Multichannel Graphic Data Entry Device For Interface With A Computer such as that described in the earlier referred to so entitled application, an automatic change interrupt occurring in response to a change in position of an infinitely adjustable knob eliminates the need for knob polling by the microprocessor when no adjustments are being made. The computer may be programmed to monitor the adjustment as it occurs or simply to sample the final value after the adjustment stops. Computer programming for implementing these functions is well within the skill of one versed in this art as is implementation of the circuitry described herein with readily available components by one skilled in the field of digital logic.

From the foregoing it will be seen that an interface between an encoder and a computer which converts quadrature phase signals from the encoder into output data which is directly readable by the computer, and fulfills all of the other objects set out above, has been provided. The improved quadrature phase signal processor of the present invention provides a level of sophistication and performance which has heretofore been unavailable in this art. The range of the processor is effectively and automatically extended so as to track the true value of the measured parameter even if that value exceeds the range of the processor hardware. Error conditions are detected and last valid data values preserved thereby enhancing the reliability of the data read by the computer. The speed range of the input signals is effectively doubled compared to prior signal processors such as that shown in U.S. Pat. No. 3,906,194. Further, computer processing overhead is minimized by providing the computer with interrupt signals indicative of the initiation and completion of changes in the measured parameter. Together these features result in a highly accurate, reliable, effective and versatile quadrature phase signal processor.

Although the invention has been described in terms of the presently preferred embodiment, it will be apparent to those skilled in the art that various modifications, substitutions, and the like can be made without departing from the spirit of the invention; the scope of which is defined by the appended claims.

What I claim is:

1. A processor for converting a pair of quadrature phase encoded signals from a linear or rotational displacement measuring device or other device producing said signals into computer readable data representative of encoder position, comprising:
   first register means for receiving the quadrature phase signals and storing the state of each of said signals for one clock cycle,
   second register means for receiving the outputs of said first register means and storing the states of each of said outputs during the same clock cycle,
   clock means connected to said first register means and said second register means for loading a new state of each of said encoded signals into said first register means and for loading the outputs of said first register means representing the previous state of each of said encoded signals into said second register means each clock cycle, decoder means for receiving the outputs of said first register means and outputs of said second register means each clock cycle and decoding these outputs to provide a binary output signal indicative of the transitions between the previous state and the new state of each of said encoded signals for each clock cycle, each such binary output signal comprising one from among a group of signals comprising an UP signal, a DOWN signal, an ERROR signal and a NO CHANGE signal, counter pulse control means for receiving from said decoder means and converting UP signals and DOWN signals to an up pulse stream and a down pulse stream respectively, counter means for receiving said up pulse stream and said down pulse stream and for outputting data in two's complement format representative of encoder position, latch means for receiving and storing the data from said counter and providing the storing data to a separate computer upon receipt of a DATA READ ACKNOWLEDGE signal from the computer, latch update control means for updating the latch with data from the counter at the clock cycle and for temporarily inhibiting latch updating upon receipt of said DATA READ ACKNOWLEDGE signal, and error control means for receiving ERROR signals from said decoder means and in response thereto providing an ERROR INTERRUPT signal simultaneously to the computer and to the latch update control means, the latch update control means inhibiting updating of the latch in response to said ERROR INTERRUPT signal, whereby last valid data is stored in the latch for readout to the computer.

2. The processor of claim 1 wherein said counter means comprises an up-down counter of limited range, and further comprising range control means for detecting an overflow or underflow of said range and in response to said detection providing an OUT-OF-RANGE INTERRUPT signal to the computer.

3. The processor of claim 1 wherein the error control means is configured to be reinitialized upon receipt of the DATA READ ACKNOWLEDGE signal from the computer.

4. The processor of claim 3 further comprising change control means for receiving and processing NO CHANGE signals from said decoder means to provide NO CHANGE INTERRUPT signals to the computer representative of no change in encoded signal states for a specified period of time and CHANGE INTERRUPT signals representative of a change in said states after a prior no change condition.

5. The processor of claim 4 wherein said change control means is configured to be reinitialized upon receipt of said DATA READ ACKNOWLEDGE signal from the computer.

6. The processor as in claims 4, wherein said counter means comprises an up-down counter of limited range, and further comprising range control means for detecting an overflow or underflow of said range and in response to said detection providing an OUT-OF-RANGE INTERRUPT signal to the computer.

7. The processor of claim 2 wherein said range control means detects an overflow or an underflow by monitoring the two most significant bits of data from said counter.

8. The processor of claim 7 wherein said range control means also provides a flag to the computer indicating whether an overflow or an underflow has been detected.

9. The processor of claim 8 wherein said counter comprises an N-bit counter where N is an integer, further in combination with a computer which responds to said OUT-OF-RANGE interrupt signal and a flag which represents an overflow to update a reference stored in the computer by adding $2^N$ to the current value of said reference, and responds to an OUT OF RANGE INTERRUPT signal and underflow flag to update the reference by subtracting $2^N$ from the current value of the reference whereby the true value of encoder position equals the sum of the updated reference and the number represented by the data outputted from the latch.

10. The processor of claim 9 wherein said range control means further includes means to deactivate the OUT-OF-RANGE INTERRUPT signal and inhibit updating of the reference stored in the computer when the overflow or underflow ceases before the computer reads the OVERFLOW/UNDERFLOW flag.

11. The processor of claim 10 wherein said decoding means comprises:
a four line to sixteen line decoder and
grouping means for grouping outputs of the decoder into UP signals, DOWN signals, ERROR signals and NO CHANGE signals.

12. The processor of claim 11 wherein the grouping means comprises a plurality of NAND gates, and wherein the clock means provides a first pulsed clock signal to the first register means, to said second register means and to said latch update control means, and an alternate pulse clock signal to said counter pulse control means.

13. A processor for converting a pair of quadrature phase encoded signals from a linear or rotational displacement measuring device or other device producing said signals into computer readable data representative of encoder position, comprising:

first register means for receiving the quadrature phase signals and storing the state of each of said signals for one clock cycle, second register means for receiving the outputs of said first register means and storing the states of each of said outputs during the same clock cycle, clock means connected to said first register means and said second register means for loading a new state of each of said encoded signals into said first register means and for loading the outputs of said first register means representing the previous state of each of said encoded signals into said second register means each clock cycle, decoder means for receiving the outputs of said first register means and outputs of said second register means each clock cycle and decoding these outputs to provide a binary output signal indicative of the transitions between the previous state and the new state of each of said encoded signals for each clock cycle, each such binary output signal comprising one from among a group of signals comprising an UP signal, a DOWN signal, an ERROR signal and a NO CHANGE signal, counter pulse control means for receiving from said decoder means and converting UP signals and DOWN signals to and up pulse stream and a down pulse stream respectively, counter means for receiving said up pulse stream and said down pulse stream and for outputting data in two's complement format representative of encoder position, latch means for receiving and storing the data from said counter for providing the stored data to a separate computer upon receipt of a DATA READ ACKNOWLEDGE signal from the computer, latch update control means for updating the latch with data from the counter at the clock cycle and for temporarily inhibiting latch updating upon receipt of said DATA READ ACKNOWLEDGE signal, and wherein said counter means comprises an up-down counter of limited range, and said processor further comprises range control means for detecting an overflow or underflow of said range and in response to said detection providing an OUT-OF-RANGE INTERRUPT signal to the computer.

* * * * *

UNITED STATES PATENT AND TRADEMARK OFFICE
CERTIFICATE OF CORRECTION

PATENT NO. : 4,714,913

DATED : December 22, 1987

INVENTOR(S) : Robert K. Cohen

It is certified that error appears in the above-identified patent and that said Letters Patent is hereby corrected as shown below:

Claim 7, line 1, "The processor of claim 2" should read "The processor of claim 6, 2 or 13".

Signed and Sealed this

Twenty-first Day of June, 1988

Attest:

DONALD J. QUIGG

Attesting Officer

Commissioner of Patents and Trademarks